United States Patent [19]

Ahmed

[11] Patent Number: 4,896,061
[45] Date of Patent: Jan. 23, 1990

[54] GAAS ANALOG SWITCH CELL WITH WIDE LINEAR DYNAMIC RANGE FROM DC TO GHZ

[75] Inventor: Syed M. Ahmed, Flemington, N.J.

[73] Assignee: Siemens Aktiengesellschaft, Berlin and Munich, Fed. Rep. of Germany

[21] Appl. No.: 283,679

[22] Filed: Dec. 13, 1988

[51] Int. Cl.$^4$ .................. H03K 17/687; H03K 3/353
[52] U.S. Cl. .................. 307/575; 307/573; 307/572; 307/577; 307/304
[58] Field of Search ............ 307/239, 571, 572, 296.5, 307/304, 575, 573, 577, 270

[56] References Cited

U.S. PATENT DOCUMENTS

| | | | |
|---|---|---|---|
| 3,448,293 | 6/1969 | Russell | 307/572 |
| 3,532,899 | 10/1970 | Huth et al. | 307/572 |
| 3,614,477 | 10/1971 | Liebman | 307/572 |
| 3,902,078 | 8/1975 | Peterson | 307/573 |
| 4,445,055 | 4/1984 | Bete | 307/573 |
| 4,712,025 | 12/1987 | Weiss | 307/572 |
| 4,808,859 | 2/1989 | Evenor et al. | 307/572 |
| 4,831,596 | 5/1989 | Tran | 307/578 |

Primary Examiner—Stanley D. Miller
Assistant Examiner—Richard Roseen
Attorney, Agent, or Firm—John Francis Moran

[57] ABSTRACT

Improved series and shunt switching cells for selectively switching an RF input signal to an output over a wide range of frequencies and in a linear manner. The series cell includes an input FET which has the source electrode clamped by means of a diode clamping circuit. The diode clamping circuit is in series with a second FET which has applied to the gate electrode a control voltage. A third FET has its source electrode connected to the source electrode of the second FET and has the drain electrode coupled through a diode to the drain electrode of the second FET. The drain electrode of the third FET is coupled to the gate electrode of a fourth FET where the source electrode of the fourth FET controls a series switching FET to enable the input signal to be switched to the output. The series switching FET has its source to drain path in series with a gate electrode of a fifth FET with the source electrode of the fifth FET coupled through a resistor to the drain electrode of the second FET and to the drain electrode of a sixth FET with the sixth FET having its source electrode coupled to the source electrodes of the second and third FETs and the gate electrode for receiving a control signal of opposite polarity to the control signal applied to the gate electrode of the second FET. The switch is a series cell which provides linear switching of the input signal to an output over a wide range of frequencies. A shunt cell also incorporates diode clamping means as well as the additional diode and resistor to enable one to again accurately switch an input signal to an output terminal over a wide range of frequencies in an extremely linear manner and according to the first and second control signals of opposite polarity which are applied to respective FETs included in the shunt circuit.

20 Claims, 3 Drawing Sheets

SERIES SWITCH-S1

SERIES SHUNT SWITCH

SERIES SWITCH-S1

SERIES SWITCH-S1-S2

SHUNT SWITCH-S3

SERIES CELL

SHUNT CELL

GAAS ANALOG SWITCH CELL WITH WIDE LINEAR DYNAMIC RANGE FROM DC TO GHZ

BACKGROUND OF THE INVENTION

This invention relates to analog switching apparatus and more particularly to a gallium arsenide MOSFET switching cell exhibiting wide linear dynamic range.

MOS devices make excellent switches and choppers for many applications such as modulators, demodulators, sample and hold systems, mixers, multiplexers, gating and similar circuits. Several important characteristics of the MOSFET make it almost ideal for these applications. One advantage is that there is no inherent offset voltage associated with MOSFETs as there is with two junction transistors, since the conduction path between drain and source is predominantly resistive. That is the conduction channel is either depleted or enhanced by controlling an induced field.

The DC gate input impedance of a MOSFET is also extremely high and requires little power since the gate is essentially a capacitor. The impedance is determined by the properties of the insulation layer of the gate. An important advantage of the MOS device when used as a switch is the exceptionally high ratio of OFF resistance to ON resistance of the drain source channel. The resistance can be as low as 50 ohms in the ON condition and higher than thousands of megohms in the OFF condition. However, a zero ON resistance is not possible with MOS devices which may be a main disadvantage in some applications.

A main disadvantage of MOS devices is the capacitance between the gate and drain, and the gate and source. The capacitance feeds through part of the gate control voltage to the signal path and is detrimental to high frequency signal isolation, also imposing a limitation on response times.

In any event, the MOS device has been utilized in the prior art in many applications as a switching device or a chopper. See for example a text entitled "Manual for MOS Users" by John D. Link, published by Reston Publishing Company Inc., a Prentice Hall company (1975). See Chapter 4 entitled "Practical MOSFET Applications" pp. 192-209.

As will be explained in regard to the prior art, FET circuits display limited linear dynamic range and basically respond poorly for large signal amplitudes. The OFF isolation of many FET circuits is poor unless there are large differences between the input signal and the applied gate voltage and as such these devices require large magnitude voltage supplies in order to enable linear switching. Thus, for many of such circuits large signal application calls for building up a large gate voltage which when added to a large input signal may present a breakdown hazard.

Another problem with employing large gate voltages is associated with a large gate resistance which prevents the gate voltage from tracking the signal over a broadband of frequency ranges. This is due to the effect of large parasitic capacitances and gate associated capacitances which are present at the gate node. Poor tracking of gate voltage with signal voltage make insertion loss as well as OFF isolation frequency dependent. However, if the gate resistor is kept reasonably small than the control current has to be proportionally increased to maintain the large gate voltage. As a result, control circuit devices have to be scaled up. Thus it was discovered that during operation of many such circuits loading of the input and the output was substantial if the control circuit devices were subjected to large signal fluctuations.

It is therefore an object of the present invention to provide an improved FET analog switch cell which cell exhibits wide linear dynamic range and which avoids many of the above-noted problems associated with the prior art.

It is a further object to provide an analog switch cell employing MOSFETs or MESFETs which exhibits improved tracking of the gate voltage with signal voltage.

These and many other objects of the present invention will be described with reference made to the detailed description of the invention.

SUMMARY OF THE INVENTION

A series switching cell (FIG. 5) for selectively switching an RF signal at an input to an output, comprising, a first FET (40) having the gate electrode adapted to receive said RF signal and having a drain electrode adapted to receive an operating potential ($V_{DD}$) and a source electrode, a second FET (49) having the source to drain path in series with the gate electrode of said first FET for receiving said RF signal, a third FET (43) having the gate electrode adapted to receive a first control signal for turning said third FET ON or OFF, a diode clamping means (41) coupled between the source electrode of said first FET and the drain electrode of said third FET, a fourth FET (39) having the gate electrode coupled to the gate electrode of said third FET (43) and having the source electrode coupled to the source electrode of said third FET and having the drain electrode coupled to said drain electrode of said third FET (43) via a diode (42), a fifth FET (48) having the gate electrode coupled to the drain electrode of said fourth FET (39) and having the source electrode coupled to the gate electrode of said second FET (49), with the source electrode of said fifth FET (48) coupled to a point of reference potential via a first current source (45), a sixth FET (50) having a drain electrode adapted to receive said operating potential ($V_{DD}$) and having a gate electrode coupled in series with said source to drain path of said second FET (49) to provide an output, and having a source electrode coupled to said drain electrode of said fourth FET (39) via a resistor (47), a seventh FET (53) having a drain electrode coupled to said source electrode of said sixth FET (50) and having a source electrode coupled to the source electrodes of said third and fourth FETs (43, 39) and coupled to a second current source (46), an eighth FET (52) having a gate electrode coupled to the gate electrode of said seventh FET (53) and a source electrode coupled to the source electrode of said seventh FET (53) with the gate electrode of said seventh and eight FETs (52,53) adapted to receive a control signal of opposite polarity to said first control signal for turning said seventh and eighth FETs ON or OFF, a ninth FET (51) having a grounded gate electrode, a drain electrode adapted to receive said operating potential ($V_{DD}$) and a source electrode coupled to the drain electrode of said eighth FET (52) wherein said RF input signal at the gate electrodes of said first FET (40) propagates to said output of said sixth FET (50) when a first level of said first control signal is applied to said gate electrodes of said seventh and eighth FET (52 and 53) and to prevent said RF input signal from propagating when a second opposite level control signal is applied to said gate electrodes while a first level control signal is applied to said gate electrodes of said third and fourth FETs (39, 43), wherein said RF signal is selectively switched from said input to output linearly for a wide range of input RF signals. There is also described a shunt switching cell which incorporates many of the features of the above-noted cell to provide linear switching of an input RF signal from an input terminal to an output terminal over a relatively wide band of frequencies. Both circuits can be implemented utilizing gallium arsenide technology and monolithic microwave integrated circuit (MMIC) techniques and hence can be fabricated as MOSFETs or MESFETs.

DETAILED DESCRIPTION OF THE FIGURES

Figure 1:
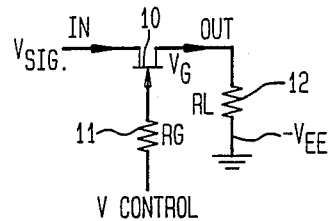
FIG. 1 depicts a schematic diagram of a prior art series switch employing an FET.

Referring to FIG. 1, there is shown a prior art analog switching device employing an FET 10. As seen, the input signal designated as $V_{SIG}$ is applied to the drain or source electrode of the FET device 10. The other output electrode, as the drain or source, is coupled to a load resistor 12. In order to turn the switch ON or OFF a control voltage (V control) is applied via a gate resistor 11 ($R_G$) to the gate electrode of the FET 10. In this manner, if the control voltage is equal to zero the FET 10 is conducting and if the control voltage is equal to $-VEE$ the FET 10 is OFF. The circuit of FIG. 1 displays a limited linear dynamic range as the circuit shown in FIG. 1 is in the ON mode for a zero control voltage.

The above operation is described for an N-channel device but the theory and characteristics apply as well for a P-channel device.

Figure 2:
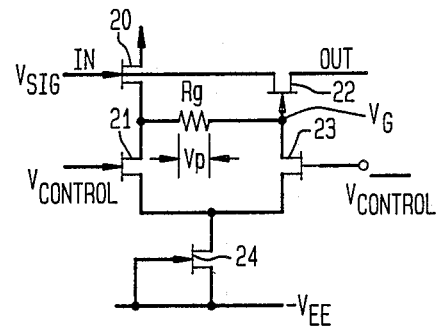
FIG. 2 is a schematic showing a prior art series switch employing FETs.

Referring to FIG. 2 there is shown another popular prior art circuit configuration which is used as a switch. Essentially, a first FET 20 has the input signal $V_{SIG}$ applied to its gate electrode. The drain to source path of FET 20 is in series with the drain to source path of FET 21. FET 21 has the control voltage $V_{CONT}$ applied to its gate electrode and the source electrode of FET 21 is returned to ground through a current source FET 24 having its source electrode connected to its gate electrode. The switch employs a resistor $R_G$ which has one terminal coupled between the junction of the source electrode of FET 20 and the drain electrode of FET 21. The gate electrode of FET 20 is coupled directly to the drain or source electrode of an additional FET 22 which appears in a series configuration and having an output electrode designated as OUT.

The FET 22 has the gate electrode coupled to the other terminal of the resistor $R_G$ and is also coupled to the drain electrode of FET 23 having its source electrode coupled to the current source FET 24. The gate electrode of FET 23 receives an input control signal which is of opposite polarity or 180° out of phase with the control voltage applied to the gate electrode of FET 21.

As one can ascertain, the circuit shown in FIG. 2 is in the OFF mode for large signals as compared to the circuit shown in FIG. 1 which is in the ON mode for large signals. As one can understand from FIG. 2, for a $V_{CONT}$ of zero FET 21 conducts thereby providing the input signal with a ground return path. The conduction of FET 21 causes FET 22 to be biased ON thus allowing the input signal to pass from input to output. In a similar manner if the control voltage is at $-VEE$ then FET 21 cannot conduct. Due to the fact that FET 21 cannot conduct, then there is no ground return for the input signal. In any event, FET 23 does conduct since it receives an opposite polarity control signal. The conduction of FET 23 causes FET 22 to be biased OFF. The circuit thus has a greater ability to discriminate between the ON and OFF states due to the use of the additional FET devices as compared to the circuit of FIG. 1.

Figure 3A:
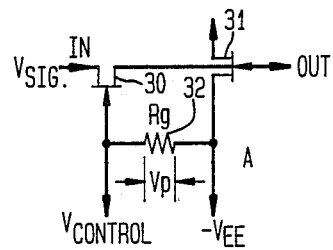
FIG. 3 (A and B) are schematics showing prior art switches employing FETs.

Referring to FIG. 3A, there is shown still another prior art configuration. In FIG. 3A the input signal $V_{SIG}$ is applied to the drain or source electrode of FET 30 which has its output electrode coupled to the gate electrode of FET 31. FET 31 has its source electrode coupled to one terminal of resistor $R_G$ and the other terminal of resistor $R_G$ is coupled to the gate electrode of FET 30. For a zero control voltage, FET 30 is conducting as is FET 31 to therefore apply the input signal to the output. For a control voltage which is negative, FET 30 is rendered OFF as is FET 31. Thus the circuit in FIG. 3 also provides more isolation between input and output due to the use of FETs 30 and 31.

Figure 3B:
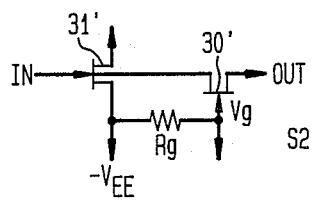

The circuit of FIG. 3B is the opposite of FIG. 3A with FET 31' at the input and FET 30' at the output ($S_2$).

In any event, while the circuits shown in FIGS. 2 and 3 are in the OFF mode for large signal applications, the OFF isolation in FIGS. 2 or 3 is poor unless $V_{SIG}-V_G$ is greater than or equal to $V_p$. These circuits may require large supply head room as for example in the circuit of FIG. 2, while somewhat less for the circuit of FIG. 3A as $V_G$ does not move at no output. In any event, insertion may be poorer for the circuits of FIG. 3A and B in applications such as T switches and so on.

In any event, referring to the circuits of FIG. 3A and B, in the ON mode the switch ($S_1$) is ON and good linearity is exhibited for both cells. In the OFF mode the entire switch is OFF, isolation is good for negative $V_{SIG}$ as for example in the circuit shown in FIG. 3A. Isolation is poor for positive $V_{SIG}$ unless $V_{SIG}-V_G$ is greater than $V_p$. In any event, if the order of the FETs were reversed, as in FIG. 3B, the same argument would apply in which case the isolation is poor for negative $V_{SIG}$ and for the above reasons breakdown may be of concern for positive $V_{SIG}$ from the input side.

Figure 4:
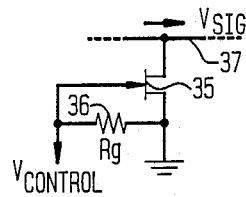
FIG. 4 is a schematic showing a prior art shunt FET switch.

Referring to FIG. 4 there is shown still another prior art switching arrangement which is designated as a shunt switch ($S_3$). As one can see from FIG. 4, the signal is applied via a line 37. The line 37 is shunted by the source to drain path of FET 35 which has its gate electrode coupled to a control voltage ($V_{CONT}$) with a resistor 36 $R_G$ connected between the gate electrode and the grounded source electrode. When the FET 35 is OFF there is no loading for positive going $V_{SIG}$. In any event, the circuit starts to load for $V_{SIG}$ that are negative unless $V_{SIG}-V_G$ is greater than $V_p$. If $V_{SIG}$ is large then for large $V_{SIG}-V_G$ (for positive $V_{SIG}$) breakdown can become a concern. If FET 35 is ON this provides good attenuation over the circuits shown in FIG. 3 as long as the summing node does not move with the input applied signal and does not move, for example, with $V_{SIG}$.

Thus in reviewing the above-noted circuits of the prior art, one can see that there is a substantial problem in regard to breakdown depending on the magnitude of the input signal. For large input signals certain of the configurations will exhibit breakdown characteristics for positive fluctuations of the input signal while other configurations are susceptible to breakdown for negative excursions of the input signal.

Generally speaking, large signal application as indicated calls for building up large $V_G$ which when added to a large input signal may present a breakdown hazard. The other problem with having large $V_G$ is associated with the large $R_G$ which prevents $V_G$ from tracking the input signal over a wide frequency range in view of the large parasitic capacitances and gate associated capacitances present at the gate electrode or at the gate node $V_G$. Poor tracking of $V_G$ with $V_{SIG}$ makes insertion loss as well as the OFF isolation completely frequency dependent. If $R_G$ is kept reasonably small then the control voltage or control current has to be proportionately increased to maintain the large $V_G$. As a result the control circuit devices have to be scaled up and utilize more power and lower speed of operation in order to accommodate this. When utilizing such switch arrangements, according to the prior art, loading of the input summing node of the switches and the output was substantial if the controlled circuit devices were large devices.

Figure 5:
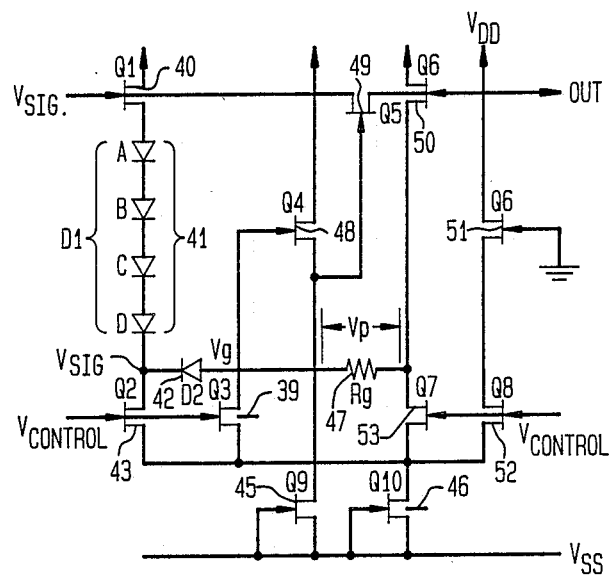
FIG. 5 is a schematic showing an improved series switching cell according to this invention.

Referring to FIG. 5 there is shown an improved series switching cell according to this invention. The circuit of FIG. 5 eliminates most of the problems, as indicated with the prior art devices and as will be explained the circuit of FIG. 5 is unique in many ways.

As seen in FIG. 5, the input signal $V_{SIG}$ is applied to the gate electrode of FET 40 having its drain electrode coupled to a point of operating potential ($V_{DD}$). The gate electrode of FET 40 is coupled to the drain electrode of FET 49 which has its source electrode coupled to the gate electrode of FET 50. FET 50 has its drain electrode coupled to the positive supply $V_{DD}$. The gate electrode of FET 50 represents the output signal (OUT).

As seen in FIG. 5, the source electrode of FET 40 is directed through a series of diodes designated as 41 to the drain electrode of the FET 43. The diodes A, B, C, D are a diode string which may be FETs connected as diodes with the anode of the string connected to the source electrode of FET 40 and the cathode connected to the drain electrode of FET 43. FET 43 receives an inverted control signal designated as $\overline{V}_{CON}$ at the gate electrode and has the source electrode coupled to the source electrodes of FET 39, 53 and 52. The connection of these source electrodes is directed through a current source FET 46 having its gate electrode coupled to its source electrode and having the drain electrode coupled to the common connected source electrodes of FETs 43, 39, 52 and 53. The gate electrode of FET 39 is coupled directly to the gate electrode of FET 43 and also receives the inverted control signal ($\overline{V}_{CONT}$). The drain electrode of FET 39 is coupled to the gate electrode of FET 48 whose drain electrode is directed to the $V_{DD}$. The gate electrode of FET 48 as connected to the drain electrode of FET 39 is coupled through a diode 42 having the anode coupled to the drain electrode of FET 39 and the cathode coupled to the drain electrode of FET 43.

The source electrode of FET 48 is directed through a current source consisting of FET 45 having its gate connected to the source electrode. The source electrode of FET 48 is coupled to the gate electrode of the series FET 49. The source electrode of FET 50 is coupled to the drain electrode of FET 53 where this junction is connected to one terminal of resistor 47 designated as $R_G$ with the other terminal of resistor 47 coupled to the anode of diode 42 which is coupled to the gate electrode of FET 48 and to the drain electrode of FET 39. The cathode of diode 42 is coupled to the drain electrode of FET 43. The FET 53 has its gate electrode coupled to the gate electrode of FET 52 with the source electrode of FET 52 coupled to the source electrode of FET 53 and with the drain electrode of FET 52 coupled to the source electrode of FET 51 having a grounded gate electrode and with the drain electrode of FET 51 directed to the source of operating potential ($V_{DD}$).

As seen in FIG. 5, the gate electrodes of FETs 43 and 39 receive the $\overline{V}_{CONT}$ signal of 180° out of phase with respect to $V_{CONT}$ as applied to the gate electrodes of FETs 52 and 53. The circuit of FIG. 5 exhibits improved operations for the following reasons.

There is improved tracking of $V_G$ with respect to $V_{SIG}$ and this is made possible by the use of the FET 48 which is arranged in a buffer configuration. The magnitude of the programmed $V_G$ is near $V_p$ instead of greater than two times $V_p$. This magnitude stays fixed over a wide dynamic range of input signals by utilizing a tracking clamp circuit which consists of FET 40 and the diode string 41 as well as FET 43 and the diode 42.

As one can ascertain from this operation, the input signal when applied to the gate electrode of FET 40 is clamped by means of the diode string 41. At the drain electrode of FET 43 the clamping action is also afforded by means of diode 42 which operates in conjunction with FET 43 to provide a clamp such that $V_G$ the control voltage is $\geq 1$ $V_p$ from either the drain end or source terminal of FET 49; hence FET 49 even in the presence of the input signal stays over a wide dynamic range by means of the clamping circuit just described. The loading of the input or output or any intermediate point is minimal since the control current is distributed by means of FETs 40 and 50. In this manner, the control circuit components utilized to generate $V_{CONT}$ are small as compared to prior art circuits.

The same circuit as shown in FIG. 5 is efficiently used for low and moderate signal levels with lower supply voltages as the turnoff voltage $V_G$ does not have large fixed headroom requirements. Thus the breakdown hazards associated with large fixed $V_G$ are substantially lowered due to the circuit configuration shown in FIG. 5.

Figure 6:
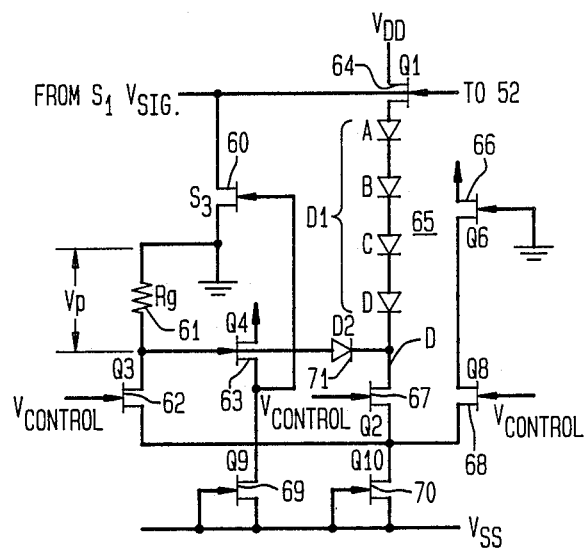
FIG. 6 is a schematic showing an improved shunt switching cell according to this invention.

The circuit configuration as shown in FIG. 5 provides an improved series switch while as will be explained the circuit configuration shown in FIG. 6 shows an improved shunt switch.

In the ON mode of a series FET $V_{GS}$ as well as $V_{GD}$ has to be maintained at a voltage greater than or equal to zero; a maximum +0.5 volts forward bias is allowed. The ON function is achieved by pulling $V_{CONT}$ high as for example to ground. In this manner no current can flow through $R_G$ or resistor 47. $V_{GS}49 + V_{GS}50 + V_{GS}48 = 0$.

It is well known that in order to control current through an FET if the gate width of both FETs are made the same size and the drain and source electrodes are of the same size then both FETs will conduct the same current. This is a requirement for FETs 48 and 50 of FIG. 5. In any event, if the current through FET 48 is less by way of FET 45 then $V_G$ is greater than or equal to zero.

During an excursion or voltage swing of the input signal $V_{SIG}$, FET 49 follows this and therefore $V_G$ tracks $V_{SIG}$. The presence of FET 48 improves this tracking over a wide frequency range. When $\overline{V}_{CONT}$ goes high and $V_{CONT}$ is low FETs 40 and 49 are OFF. In this case current is pulled through resistor 47 via FET 39 specifying that $V_G$ OFF is approximately equal to $I_{CONT}$ times $R_G$ less $V_{GS}$ 50 which is set below the reference or the output side of the switch thereby turning FETs 49 OFF ($S_1$ and $S_2$).

This situation remains the same for $V_{SIG}$ equal to or greater than zero or for the reference which is ground by way of FET 43 being ON in the T switch. In any event when $V_{SIG}$ drops below zero the clamping action of diodes 41 and FET 40 which is string biased from diode 42 (ON for $\overline{V}_{CONT}$ high) moves down with $V_{SIG}$. As soon as this voltage is less than $V_G$ the diode 42 conducts and pulls additional current through resistor 47 thereby lowering $V_G$. This action continues until nearly all the current from FET 43 is flowing through resistor 47 and FET 40. The diode string 41 is starved for current in this condition. Up to that point, which is also the end of the dynamic range, both FETs 40 and 49 remain OFF. Note that these FETs are not strained excessively since $V_{SIG} - V_G$ is approximately equal to $V_p$ where $V_p$ equals the current through FET 39 times resistor 47; while on the reference side (ground $- V_G$) is approximately equal to the current through FET 39 plus the current through diode 42 times R47 which is approximately equal to $V_{SIG}$ peak negative plus 1 $V_p$. The same holds true for positive swings of the input signal $V_{SIG}$.

Referring to FIG. 6 there is shown a shunt cell which operates according to the above-described modes. The input signal $V_{SIG}$ is applied to the drain electrode of FET 60 having its source electrode coupled to the point of reference potential or ground and coupled via resistor 63 ($R_G$) to the gate electrode of FET 63. The drain electrode of FET 63 is directed to the source of operating potential $V_{DD}$. The source electrode of FET 63 is coupled to a point of reference potential ($V_{SS}$) through a current source FET 69 having its gate connected to the source. The source electrode of FET 63 is coupled to the gate electrode of FET 60. The terminal of resistor 61, which is coupled to the gate electrode of FET 63, is also coupled to the drain electrode of FET 62. FET 62 receives the $V_{CONT}$ voltage at the gate electrode and has its source electrode coupled to the source electrodes of FETs 67 and 68. The FETs 67 and 68 are directed to the point of reference potential or the negative supply $V_{SS}$ via a current source FET 70 having its gate electrode coupled to its source electrode.

The drain electrode of FET 67 is coupled to the cathode of a diode 71. The diode 71 has its anode electrode coupled to the gate electrode of FET 63. The cathode of diode 71 is coupled to the cathode of a series string of diodes 65 (A, B, C, D) which are as diodes 41 of FIG. 5. The anode of the first diode in the string 65 is coupled to the source electrode of FET 64 which has its drain electrode coupled to the source of operating potential $V_{DD}$. The gate electrode of FET 64 is connected to to $S_2$ which is located in FIG. 7.

As one can see from FIG. 6, $V_{CONT}$ is applied to the gate electrode of FET 62, to the gate electrode of FET 67 while FET 68 receives $\overline{V}_{CONT}$ of opposite polarity. The drain electrode of FET 68 is coupled to the source electrode of FET 66 which has a grounded gate electrode and whose drain is coupled to $+V_{DD}$. As one can ascertain, the circuit of FIG. 6 is similar in many respects to the circuit of FIG. 5 except that the circuit of FIG. 6 operates in a shunt mode as compared to the series mode of operation of the circuit of FIG. 5.

The shunt element 60 shown in FIG. 6 is similar in function to FETs 40 and 49 of FIG. 5, the difference being that the output side has been grounded while transistors 49 and 53 have been removed in the circuit of FIG. 6. The resistor 61, $R_G$ is grounded at one end at the grounded source electrode of FET 60 ($S_3$). The timing of FET 60 is the complement of the operation of the above circuit and that is that FET 60 is ON when FETs 40 and 49 of FIG. 5 are OFF. The above discussions of operation apply to the operation of FET 60.

Figure 7:
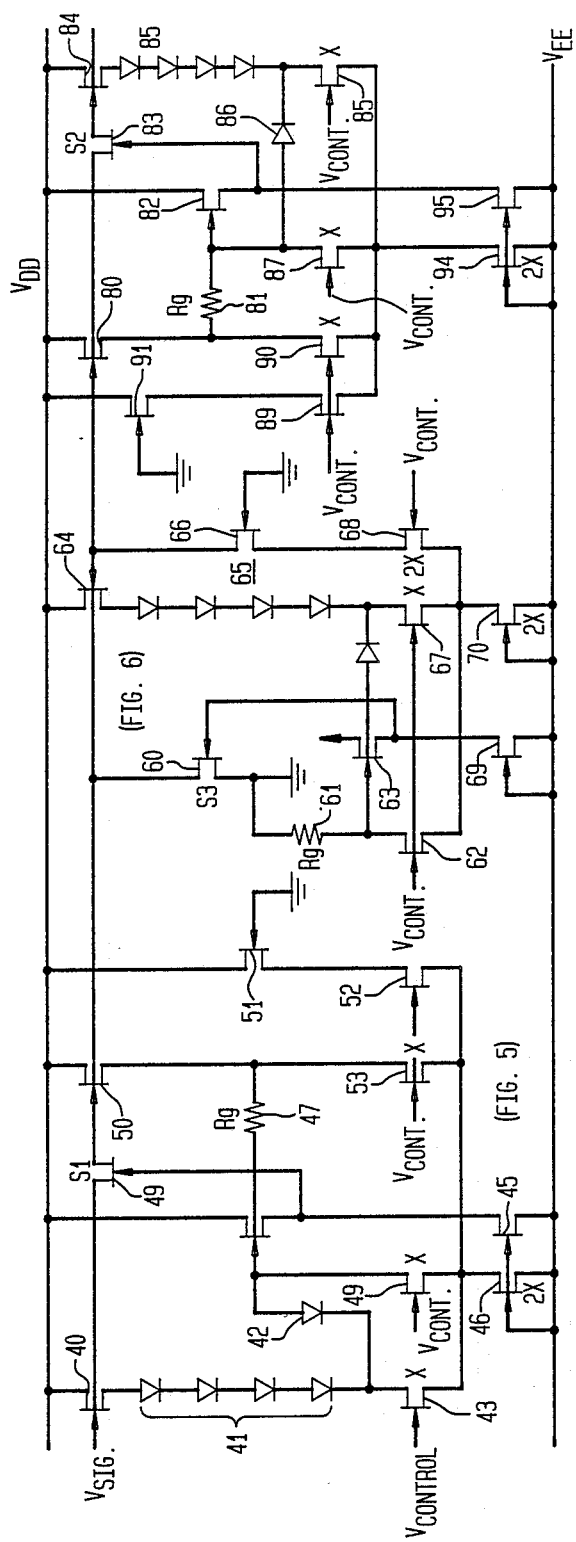
FIG. 7 is a detailed schematic showing the use of the improved switches of FIG. 5 and FIG. 6 in a T-switch arrangement.

Referring to FIG. 7 there is shown a complete T-switch which is constructed from the cells shown in FIGS. 5 and 6. The characteristics of this switch are a highly linear dynamic range of signal switching over a wide range of frequencies and operative all the way down to DC. It is understood that each and every FET as shown in all figures may be MOSFETs or MESFETs fabricated from gallium arsenide using monolithic microwave integrated circuit (MMIC) techniques and hence each of the circuits is capable of being integrated on a single integrated circuit board and exhibit wide and high frequency operation in all respects.

In order to understand the arrangement shown in FIG. 7, the same reference numerals have been utilized for the corresponding switches as for example the switch of FIG. 5 and the switch of FIG. 6 as will be apparent to one reviewing FIG. 7.

It is noted in FIG. 7 various devices are associated with an X or 2X. This means that such devices, as for example all X devices, have the same gate width and source and drain electrode configurations and are capable of passing the same amount of current. Devices indicated as 2X have twice the gate width and are capable of handling twice the current. These techniques for fabricating MOSFETs or MESFETs of different gate widths and different gain or current carrying capacity is well known in the state of the art.

Thus as shown in FIG. 7 the input signal $V_{SIG}$ is applied to the gate electrode of FET 40 which gate electrode is coupled to the source to drain path of FET 49 which is designated as $S_1$. The output via the gate electrode of FET 50 is applied to the shunt switch of FIG. 6 showing all components of FIG. 6 designated by the same reference numerals. In any event, the output of the switch at the gate electrode of FET 64, is applied to the gate electrode of FET 80. The drain electrode of FET 80 is coupled to the $V_{DD}$ supply. The source electrode of FET 80 is coupled to one terminal of a resistor 81 designated as $R_G$. The other terminal of resistor 81 is coupled to the gate electrode of FET 82 having its drain coupled to the $V_{DD}$ supply. The source electrode of FET 82 is coupled to the gate electrode of FET 83 designated as $S_2$ where the source to drain path of FET 83 is coupled to the gate electrode of FET 84. FET 84 has a diode string 85 coupled to the source electrode with the cathode of the diode string coupled to the drain electrode of FET 85. The drain electrode of FET 85 is also coupled to the cathode of diode 86 with the anode of diode 86 coupled to the gate electrode of FET 82 and to the drain electrode of FET 87. The source electrode of FET 87 is coupled to the source electrode of FET 85 and is coupled to the source electrodes of FETs 89 and 90. The gate electrodes of FETs 89 and 90 are coupled together and to the $V_{CONT}$ or V control voltage. The drain electrode of FET 89 is coupled to the source electrode of FET 91 having its gate electrode grounded with the drain electrode of FET 91 coupled to the $V_{DD}$ supply. The drain electrode of FET 90 is coupled to the other terminal of resistor 81 and coupled to the source electrode of FET 80.

The current path for FETs 89, 90, 87 and 85 is directed through current source FET 94 having its gate connected to its source. The current path for FET 82 is directed through the source to drain path of FET 95 having its gate electrode coupled to its source electrode and also serving as a current source.

As one can see, the circuit shown in FIG. 7 at the output is in fact the same circuit as shown in FIG. 5 with inputs and outputs exchanged. It is seen that the circuit in FIG. 7 shows a complete T switch which is constructed from the above cells. The characteristics of this switch is that it possesses a highly linear dynamic range over a wide frequency range and can operate all the way down to DC.

I claim:

1. A series switching cell (FIG. 5) for selectively switching an RF signal at an input to an output, comprising:

a first FET (40) having a gate electrode adapted to receive said RF signal and having a drain electrode adapted to receive an operating potential ($V_{DD}$) and a source electrode;

a second FET (49) having a source to drain path in series with the gate electrode of said first FET for receiving said RF signal;

a third FET (43) having a gate electrode adapted to receive a first control signal ($V_{CONT}$) for turning said third FET ON or OFF;

a diode clamping means (41) coupled between the source electrode of said first FET and a drain electrode of said third FET;

a fourth FET (39) having a gate electrode coupled to the gate electrode of said third FET (43) and having a source electrode coupled to a source electrode of said third FET and having a drain electrode coupled to said drain electrode of said third FET (43) via a diode (42);

a fifth FET (48) having a gate electrode coupled to the drain electrode of said fourth FET (39) and having a source electrode coupled to a gate electrode of said second FET (49), with the source electrode of said fifth FET (48) coupled to a point of reference potential via a first current source (45);

a sixth FET (50) having a drain electrode adapted to receive said operating potential ($V_{dd}$) and having a gate electrode coupled in series with said source to drain path of said second FET (49) to provide an output, and having a source electrode coupled to said drain electrode of said fourth FET (39) via a resistor (47);

a seventh FET (53) having a drain electrode coupled to said source electrode of said sixth FET (50) and having a source electrode coupled to the source electrodes of said third and fourth FETs (43, 39) and coupled to a second current source (46);

an eighth FET (52) having a gate electrode coupled to the gate electrode of said seventh FET (53) and a source electrode coupled to the source electrode of said seventh FET (53) with the gate electrode of said seventh and eight FETs (52,53) adapted to receive a control signal ($V_{CONT}$) of opposite polarity to said first control signal for turning said seventh and eight FETs ON or OFF;

a ninth FET (51) having a grounded gate electrode, a drain electrode adapted to receive said operating potential and source electrode coupled to the drain electrode of said eighth FET (52) wherein said RF input signal at the gate electrodes of said first FET (40) propagates to said output of said sixth FET (50) when a first level of said first control signal is applied to said gate electrodes of said seventh and eighth FET (52 and 53) and to prevent said RF input signal from propagating when a second opposite level control signal is applied to said gate electrodes of said seventh and eighth FETs while a first level control signal is applied to said gate electrodes of said third and fourth FETs (39, 43), wherein said RF signal is selectively switched from said input to output linearly for a wide range of input RF signals.

2. The series switching cell according to claim 1 wherein said diode clamping means is a string of diodes having an anode of said string coupled to the source electrode of said first FET (40) and the cathode of said string coupled to the drain electrode of said third (FET 43).

3. The series switching cell according to claim 1 wherein said diode (42) has an anode coupled to said drain electrode of said fourth FET (39) and a cathode coupled to the drain electrode of said third FET (43).

4. The series switching cell according to claim 1 wherein said first current source includes a tenth FET (45) having a drain to source path in series with the source electrode of said fourth FET (48) and having a source electrode connected to a gate electrode to form a diode.

5. The series switching cell according to claim 1 wherein said second current source includes an eleventh FET (46) having a drain to source path in series with said source electrodes of said third, fourth, seventh and eighth FETs (43, 39, 52, 53) and having a source electrode connected to a gate electrode to form a diode.

6. The series switching cell according to claim 1 wherein said FETs are MOSFETs.

7. The series switching cell according to claim 1 wherein said FETs are MESFETs.

8. The series switching cell according to claim 6 wherein said MOSFETs are GaAs FETs.

9. The series switching cell according to claim 7 wherein said MESFETs are GaAs FETs.

10. The series switching cell according to claim 1 wherein said FETs are N-channel FETs.

11. A shunt switching cell (FIG. 6) for selectively switching an RF signal at an input to an output comprising:

a first FET (60) having a drain electrode adapted to receive said RF input signal and having a source electrode coupled to a point of reference potential and having a gate electrode;

a second FET (64) having a gate electrode coupled to said drain electrode of said first FET (60) and for providing an output terminal, a drain electrode adapted to receive an operating potential ($V_{DD}$) and a source electrode;

a diode clamping means (65) coupled to said source electrode of said second FET (64) at one end and having another end;

a third FET (62) having a gate electrode for receiving a first control signal ($V_{cont.}$) for turning said third FET (62) ON or OFF according to the polarity of said control signal, with a drain electrode of said third FET (62) coupled to the source electrode of said first FET (60) via a resistor (61);

a fourth FET (63) having a gate electrode coupled to the drain electrode of said third FET (62) and having a drain electrode adapted to receive said operating potential ($V_{DD}$), with a source electrode of said fourth FET (63) coupled to the gate electrode of said first FET (60) and returned to a point of reference potential via a first current source (69);

a fifth FET (67) having a gate electrode coupled to the gate electrode of said third FET (62) for receiving said first control signal and a source electrode coupled to a source electrode of said third FET (62) and returned to a point of reference potential via a second current source (70), and having a drain electrode coupled to said other end of said diode clamping means;

a diode (71) having one terminal coupled to the drain electrode of said fifth FET (67) and one terminal coupled to the gate electrode of said fourth FET (63);

a sixth FET (68) having a gate electrode adapted to receive a second control signal ($V_{CONT}$) of opposite polarity to said first to turn said sixth FET (68) ON or OFF, and having a source electrode coupled to the source electrodes of said third and fifth FETs (62, 67) and having a drain electrode;

an seventh FET (66) having a grounded gate electrode, a source electrode coupled to the drain electrode of said sixth FET (68) and a drain electrode adapted to receive said operating potential ($V_{DD}$) whereby when said first control signal turns said third and fifth FETs (62, 67) ON said RF signal propagates from input to output and when said second control signal turns said third and fifth FETs OFF said second control signal turns said sixth FET (68) ON to prevent said RF signal from propagating to said output wherein said RF signal is selectively switched from said input to output linearly over a wide range of input RF signals.

12. The shunt switching cell according to claim 11 wherein said diode clamping means is a string of diodes having an anode of said string coupled to said source electrode of said second FET (64) and a cathode coupled to said drain electrode of said fifth FET (67).

13. The shunt switching cell according to claim 11 wherein said diode (71) has an anode connected to the gate electrode of said fourth FET (63) and a cathode connected to the drain electrode of said fifth FET (67).

14. The shunt switching cell according to claim 11 wherein said first current source includes an eighth FET (69) having a source to drain path in series with the source electrode of said fourth FET (63) and having a source electrode connected to a gate electrode to form a diode.

15. The shunt switching cell according to claim 11 wherein said second current source includes a ninth FET (70) having a source to drain path in series with the source electrode of said third, fifth and sixth FETs (62, 67, 68) and having a gate and source electrodes connected to form a diode.

16. The shunt switching cell according to claim 11 wherein said FETs are MOSFETs.

17. The shunt switching cell according to claim 11 wherein said FETs are MESFETs.

18. The shunt switching cell according to claim 16 wherein said MOSFETs are GaAs FETs.

19. The shunt switching cell according to claim 17 wherein said MESFETs are GaAs FETs.

20. The shunt switching cell according to claim 11 wherein said FETs are N-channel FETs.

* * * * *